United States Patent
Young et al.

(10) Patent No.: US 7,092,293 B1
(45) Date of Patent: Aug. 15, 2006

(54) NON-VOLATILE MEMORY CELL INTEGRATED WITH A LATCH

(75) Inventors: Phillip A. Young, Albuquerque, NM (US); Sunhom Paak, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 251 days.

(21) Appl. No.: 10/721,855

(22) Filed: Nov. 25, 2003

(51) Int. Cl.
  *G11C 11/34* (2006.01)
(52) U.S. Cl. ............................ 365/185.23; 365/185.05; 365/185.14
(58) Field of Classification Search ........... 365/189.05, 365/185.05, 185.23, 185.14, 185.29, 185.33
  See application file for complete search history.

(56) References Cited

U.S. PATENT DOCUMENTS 5,548,552 A * 8/1996 Madurawe ............. 365/185.33
5,572,715 A * 11/1996 Gowni ........................ 713/500
5,982,683 A * 11/1999 Watson et al. ............... 365/201
6,172,519 B1 * 1/2001 Chiang et al. ................. 326/38
6,243,296 B1 * 6/2001 Sansbury ............... 365/185.18

* cited by examiner

*Primary Examiner*—Richard Elms
*Assistant Examiner*—Hien N Nguyen
(74) *Attorney, Agent, or Firm*—E. Eric Hoffman; Justin Liu

(57) ABSTRACT

A configuration circuit includes a latch and a dedicated non-volatile memory cell. The non-volatile memory cell is initially programmed or erased. The latch is then set to store a first logic value by coupling the latch to a first voltage supply terminal in response to an activated control signal. When the control signal is de-activated, the latch is de-coupled from the first voltage supply terminal and coupled to the non-volatile memory cell. If the non-volatile memory cell is programmed, the latch is coupled to a second voltage supply terminal, thereby storing a second logic value in the latch. If the non-volatile memory cell is erased, the latch is isolated from the second voltage supply terminal, and the first logic value remains stored in the latch. The latch can also be directly written through one or more access transistors, thereby facilitating testing.

12 Claims, 2 Drawing Sheets

US 7,092,293 B1

NON-VOLATILE MEMORY CELL INTEGRATED WITH A LATCH

FIELD OF THE INVENTION

The present invention relates to a method and structure for configuring a programmable logic device. More specifically, the present invention relates to a non-volatile memory cell integrated with a latch to enable a simplified power up configuration cycle, while retaining the testability advantages associated with a latch.

RELATED ART

Conventional programmable logic device (PLD) designs require a power-up initialization cycle. During this cycle, the contents of a non-volatile memory, commonly an electrically erasable memory, array are transferred into a plurality of latches embedded in a logic core. This transfer typically occurs over a plurality of memory cycles, on an address-by-address basis. For example, a conventional PLD, such as a complex programmable logic device (CPLD), may include an electrically erasable memory array that stores 10,000 configuration values, which are loaded into corresponding latches 100 bits at a time. Thus, 100 transfers must be made from the electrically erasable memory array to the latches in order to configure the PLD. Once the configuration values are stored in the latches, the latches configure the logic core to implement a user-defined application.

Two drawbacks of a conventional initialization cycle are the complex circuitry required to transfer the configuration values from the electrically erasable memory array to the latches, and the relatively long time required to transfer the configuration values from the electrically erasable array to the latches. In addition, the conventional initialization process is subject to disruption from noise and variations in the power supply voltage.

The latches are used in conjunction with the electrically erasable memory cells (rather than, for example, simply replacing the latches with electrically erasable memory cells) in order to facilitate testing of the PLD. Testing requires that the PLD be configured in many different ways to verify proper function of the PLD. Each write operation to a latch can be implemented in microseconds, while each erase/write operation to an electrically erasable memory cell requires milliseconds. Thus, during testing, configuration values are written directly to the latches (bypassing the electrically erasable memory array), thereby reducing the required testing time by about 90%. Reduced testing time translates to reduced testing costs.

Another conventional PLD uses the polysilicon floating gate of an electrically erasable memory cell to bias a CMOS inverter. This PLD disadvantageously requires long routing of the polysilicon floating gate, which reduces the cell coupling coefficient and increases the likelihood of charge leakage. In addition, the charge stored on the polysilicon floating gate must be sufficient to drive the output of the CMOS inverter from rail to rail. Such a polysilicon floating gate structure as described in U.S. Pat. No. 5,272,368.

It would therefore be desirable to have an improved structure and method for configuring a PLD.

SUMMARY

Accordingly, the present invention provides a configuration circuit that includes a latch circuit coupled to provide a configuration value to the logic core of a programmable logic device, a dedicated non-volatile memory cell, and an initialization circuit coupled to the non-volatile memory cell and the latch circuit. The latch circuit can include a pair of cross-coupled inverters.

In one embodiment, the initialization circuit includes a first transistor configured to couple the latch circuit to a first voltage supply terminal. When the first transistor is enabled, the latch circuit is initialized to store a configuration value having a first logic state. The initialization circuit also includes a second transistor configured to couple the latch circuit to the non-volatile memory cell. When the second transistor is enabled, the latch circuit is coupled to a read path of the non-volatile memory cell. Depending on the programmed/erased state of the non-volatile memory cell, this read path may be conductive or non-conductive. If the read path is non-conductive, the configuration value stored in the latch circuit remains at the first logic state. Conversely, if the read path is conductive, then the latch circuit is coupled to a second voltage supply terminal, thereby causing the latch circuit to store a configuration value having a second logic state.

Because the latch circuit is locally coupled to the dedicated non-volatile memory cell by the initialization circuit, there is no requirement for complex circuitry to access and transfer the configuration value.

One or more direct access transistors can also be coupled to the latch circuit, thereby enabling the latch circuit to be rapidly written with different configuration values during testing.

The present invention also includes a method of configuring a programmable logic device. This method includes: (1) erasing a group of non-volatile memory cells located on the programmable logic device, (2) programming selected memory cells of the group, (3) activating a set control signals to couple a plurality of latch circuits to a first voltage supply terminal, thereby storing a configuration value having a first logic state in each of the latch circuits, and (4) de-activating the set control signal to couple each of the latch circuits to a corresponding one of the memory cells, wherein each of the latch circuits coupled to a programmed memory cell is coupled to a second voltage supply terminal, thereby storing a configuration value having a second logic state in the associated latch circuit. The programmable logic device is then configured in response to the configuration values stored in the latch circuits.

The method can further include writing configuration values directly to the latch circuits through corresponding access transistors.

The present invention will be more fully understood in view of the following description and drawings.

DETAILED DESCRIPTION

Figure 1:
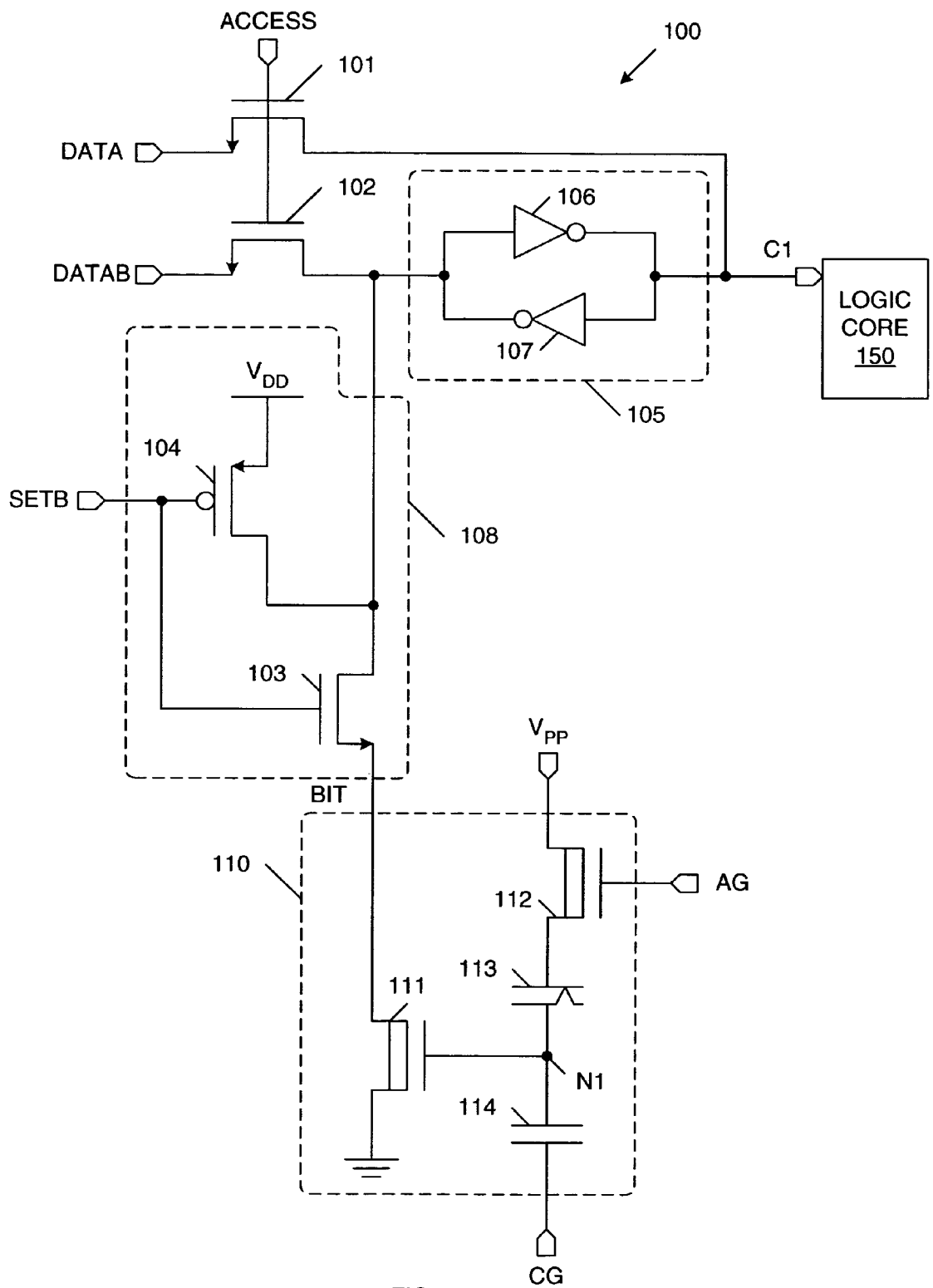
FIG. 1 is a circuit diagram of a configuration circuit in accordance with one embodiment of the present invention.

FIG. 1 is a circuit diagram of a configuration circuit 100 in accordance with one embodiment of the present invention. Configuration circuit 100 includes n-channel field effect transistors 101–103, p-channel field effect transistor 104, latch 105 and non-volatile electrically erasable memory cell 110. Latch 105 is formed by cross-coupled inverters 106 and 107. Transistors 103 and 104 form an initialization circuit 108. Electrically erasable memory cell 110 includes high-voltage n-channel transistors 111–112, bi-directional thin-oxide tunnel diode 113 and capacitor 114. In the described embodiment, each of transistors 101–104 has a width-to-length ratio of 0.44/0.22, and each of the cross-coupled inverters 106–107 is created by transistors having a width-to-length ratio of 0.44/1.00. However, other dimensions are possible in other embodiments.

The sources of n-channel transistors 101 and 102 are coupled to receive a data value (DATA) and the inverse of the data value (DATAB), respectively. The gates of n-channel transistors 101 and 102 are commonly coupled to receive an access control signal (ACCESS). The drain of transistor 101 is coupled to the output terminal of latch 105, and to an output terminal that provides a configuration value (C1) for configuring the logic core 150 of an associated PLD. Many other configuration circuits (not shown), which are identical to configuration circuit 100, may provide configuration values to logic core 150. The drain of transistor 102 is coupled to the input terminal of latch 105.

The gates of transistors 103 and 104 are commonly coupled to receive an active-low set signal (SETB). The source of p-channel transistor 104 is coupled to receive a positive supply voltage $V_{DD}$. In some embodiments, $V_{DD}$ may be approximately 1.8 Volts. The drain of p-channel transistor 104 is coupled to the input terminal of latch 105.

The source of n-channel transistor 103 is coupled to receive a configuration bit (BIT) from electrically erasable memory cell 110. The drain of n-channel transistor 103 is coupled to the input terminal of latch 105.

High voltage n-channel transistor 111 has a source coupled to a ground voltage supply terminal, a drain coupled to the source of transistor 103, and a gate coupled to node N1. Capacitor 114 is coupled between node N1 and a terminal configured to receive a control gate voltage (CG). Tunnel diode 113 is coupled between node N1 and the drain of high-voltage n-channel transistor 112. High-voltage transistor 112 includes a gate coupled to receive an access gate voltage (AG) and a source coupled to receive a programming voltage ($V_{PP}$). High-voltage transistors 111–112 have a relatively thick gate oxide, compared to transistors 101–104, thereby enabling these high-voltage transistors 111–112 to handle voltages much greater than the nominal supply voltage. In the described embodiment, the high-voltage transistors 111–112 are capable of handling voltages greater than 14 Volts, without incurring damage.

In the described embodiment, node N1 represents a floating polysilicon layer, which is common to transistor 111, capacitor 114 and tunnel diode 113. More specifically, node N1 is a polysilicon layer that forms the gate electrode of high voltage transistor 111, a plate electrode of capacitor 114, and an electrode of tunnel diode 113. In the described embodiment, tunnel diode 113 is created by forming a thin oxide layer over the drain of high-voltage transistor 112, and then forming the polysilicon layer (N1) over this thin oxide layer.

Configuration circuit 100 operates as follows in accordance with one embodiment of the present invention. Electrically erasable memory cell 110 is placed in a programmed or erased state prior to an initial power up configuration cycle of the system.

An erase operation is performed by applying a low programming voltage $V_{PP}$ to the source of high-voltage transistor 112, a high positive access gate voltage AG to the gate of access transistor 112, and a high positive control gate voltage CG to capacitor 114. The high positive voltage is significantly higher than the nominal operating voltage $V_{DD}$ of the associated PLD. Table 1 summarizes the voltages applied to electrically erasable memory cell 110 during an erase operation in accordance with one embodiment of the present invention.

TABLE 1

| ERASE VOLTAGES | |
|---|---|
| SIGNAL | VOLTAGE |
| AG (Access Gate) | 10–16 Volts |
| CG (Control Gate) | 10–16 Volts |
| $V_{PP}$ | 0 Volts |

The high positive access gate voltage AG turns on access transistor 112, and electrons pass through tunnel diode 113 into node N1 under the influence of voltages on nodes $V_{PP}$ and CG with the result that a net negative charge accumulates on node N1. As a result, a negative electronic charge is trapped on node N1. Since negative electronic charge is trapped on node N1, the threshold voltage of high-voltage transistor 111 increases. The erase operation continues until the high-voltage transistor 111 exhibits a relatively high threshold voltage of about 2 Volts or more. In accordance with one embodiment, all of the electrically erasable memory cells on the PLD are erased simultaneously. In another embodiment, large blocks of the electrically erasable memory cells on the PLD are erased sequentially, until all of the electrically erasable memory cells on the PLD are erased.

After all of the electrically erasable memory cells on the PLD have been erased, programming operations are performed on selected electrically erasable memory cells. The programmed/erased memory cells are selected to provide a desired configuration to logic core 150.

A programming operation is performed by applying a high programming voltage of 10–16 Volts to the drain and gate of the AG transistor 112 and a low control gate voltage CG to capacitor 114. Table 2 summarizes the voltages applied to electrically erasable memory cell 110 during a programming operation in accordance with one embodiment of the present invention.

TABLE 2

| PROGRAMMING VOLTAGES | |
|---|---|
| SIGNAL | VOLTAGE |
| AG | 10–16 Volts |
| CG | 0 Volts |
| $V_{PP}$ | 10–16 Volts |

The high positive access gate voltage AG turns on access transistor 112, and electrons pass through tunnel diode 113 out of node N1 under the influence of voltages on nodes $V_{PP}$ and CG with the result that a net positive charge accumulates on node N1. As a result, negative electronic charge, which was previously trapped on node N1 during the erase operation, is removed from node N1. The net result of the programming operation is that a positive electronic charge is stored on node N1. As positive electronic charge is trapped on node N1, the threshold voltage of high-voltage transistor 111 decreases. The program operation continues until the high-voltage transistor 111 exhibits a relatively low threshold voltage of about −2 Volts or less.

During the initial power-up configuration cycle, the electrically erasable memory cells (e.g., memory cell 110) are biased such that the contents of these memory cells can be read. In accordance with one embodiment, the contents of the electrically erasable memory cells are read by applying a ground supply voltage to the programming voltage terminal $V_{PP}$, the access gate terminal AG and the control gate terminal CG. Table 3 summarizes the voltages applied to electrically erasable memory cell 110 during a read operation.

TABLE 3

READ VOLTAGES

| SIGNAL | VOLTAGE |
|---|---|
| AG | 0 Volts |
| CG | 0 Volts |
| $V_{PP}$ | 0 Volts |

If electrically erasable memory cell 110 is programmed, then transistor 111 is turned on in response to the read voltages, thereby coupling the source of transistor 103 to the ground supply voltage terminal. That is, the BIT signal has a logic low value. However, if electrically erasable memory cell 110 is erased, then transistor 111 is turned off in response to the read voltages, such that the source of transistor 103 is not connected to the ground supply voltage terminal. Advantageously, all of the read voltages are 0 Volts, such that the read operation can be performed with minimal power requirements.

Also during the initial power-up configuration cycle, the SETB signal is pulsed to a logic low (active) state. The logic low SETB signal turns on p-channel transistor 104 and turns off n-channel transistor 103. As a result, the input terminal of latch 105 is coupled to the VDD voltage supply terminal. Turned off n-channel transistor 103 blocks current from flowing through the read path of electrically erasable memory cell 110. Because the input terminal of latch 105 is coupled to receive a logic high voltage ($V_{DD}$), latch 105 initially provides a logic low configuration value (C1). That is, latch 105 initially stores a logic low configuration value.

After latch 105 is programmed to store the logic low configuration value, the SETB signal is de-activated to a logic high state, thereby turning off p-channel transistor 104 and turning on n-channel transistor 103. As a result, the input terminal of latch 105 is electrically coupled to electrically erasable memory cell 110. If electrically erasable memory cell 110 is in the programmed state, the input terminal of latch 105 is pulled down to a logic low state through transistors 111 and 103. In this case, the output of latch 105 provides a logic high configuration value C1. That is, latch 105 stores a logic high configuration value.

However, if electrically erasable memory cell 110 is in the erased state, transistor 111 is turned off, and the input terminal of latch 105 is not pulled down to a logic low state. As a result, latch 105 continues to store a logic low configuration value C1.

To perform tests, such as path evaluation tests, all of the electrically erasable memory cells (e.g., memory cell 110) of the PLD are erased, and the SETB signal is de-activated to a logic high state. Under these conditions, transistor 104 is turned off, thereby isolating latch 105 from the VDD voltage supply terminal. In addition, transistor 111 is turned off, thereby isolating latch 105 from the ground voltage supply terminal. At this time, latch 105 can be written through n-channel transistors 101 and 102. More specifically, the ACCESS signal is activated to a logic high state, thereby turning on n-channel transistors 101–102. A configuration data value (DATA) and the inverse of the configuration data value (DATAB) are applied to sources of transistors 101 and 102, respectively. As a result, the configuration data value (DATA) is stored in latch 105 and provided to as the configuration value C1. The DATA/DATAB values can be provided much faster than performing an erase/program operation to electrically erasable memory cell 110. Thus, tests, such as path evaluation tests, can be performed in a relatively fast manner.

Figure 2:
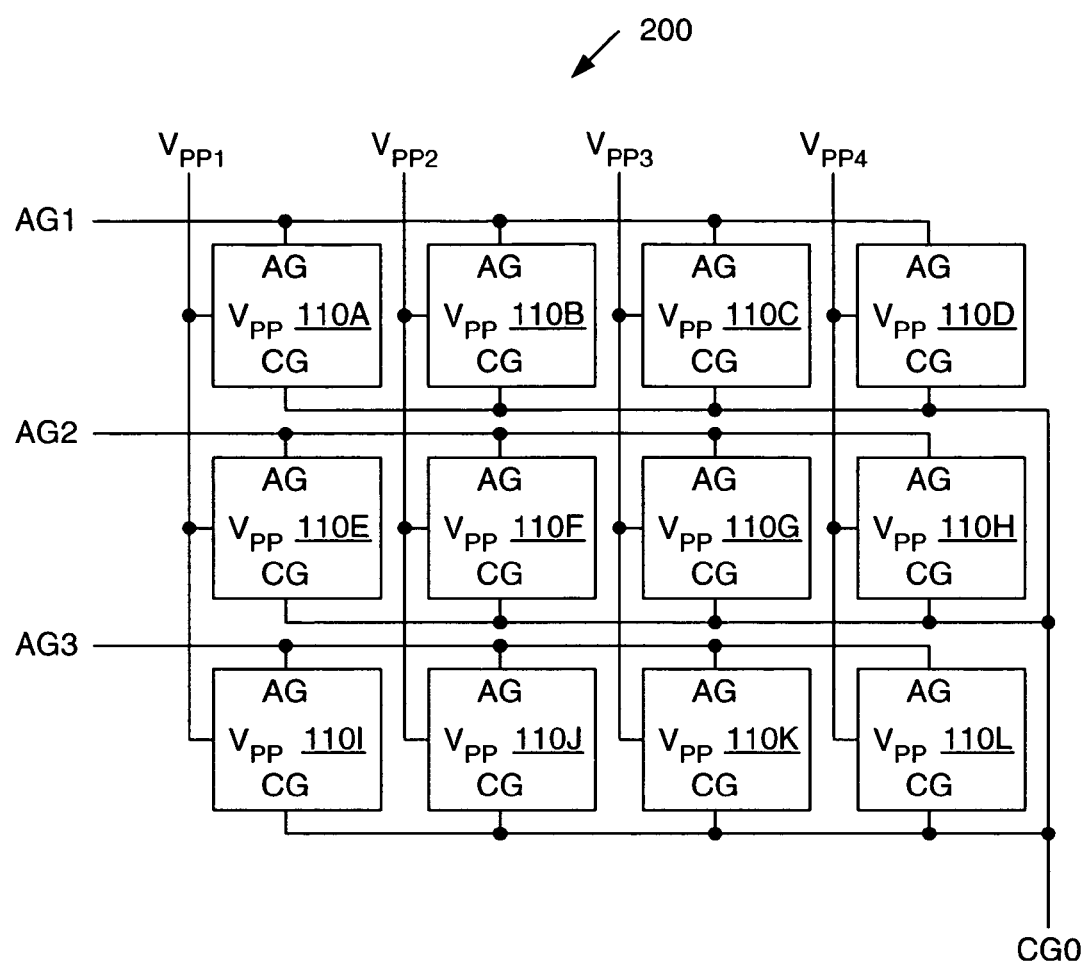
FIG. 2 is a block diagram illustrating an array of electrically erasable memory cells in accordance with one embodiment of the present invention.

FIG. 2 is a block diagram illustrating an array 200 of electrically erasable memory cells 110A–110L in accordance with one embodiment of the present invention. The latches and other elements associated with electrically erasable memory cells 110A–110L are not illustrated in FIG. 2 for purposes of clarity. However, it is understood that there is a latch corresponding to latch 105 (FIG. 1) located physically adjacent to each of memory cells 110A–110L.

Electrically erasable memory cells 110A–110L are arranged in three rows and four columns in the described example. The access gate terminals AG of the memory cells in the first, second and third rows are coupled to receive access gate signals AG1, AG2 and AG3, respectively. The programming terminals $V_{PP}$ of the memory cells in the first, second, third and fourth columns are coupled to receive programming signals $V_{PP1}$, $V_{PP2}$, $V_{PP3}$ and $V_{PP4}$, respectively. The control gate terminals of the memory cells 110A–110L are connected to receive a common control gate signal CG0.

Memory cells 110A–110L are simultaneously erased by setting $V_{PP1}$–$V_{PP4}$ equal to 0 Volts, CG0 equal to 10–16 Volts and AG1–AG3 equal to 10–16 Volts. Memory cells 110A–100L can be programmed on a cell-by-cell basis, a row-by-row basis, or a column-by-column basis. Table 4 below defines the voltages $V_{PP1}$–$V_{PP4}$, AG1–AG3 and CG0 required to program memory cell 110B.

TABLE 4

CELL-BY-CELL PROGRAMMING VOLTAGES

| $V_{PP1}$ | $V_{PP2}$ | $V_{PP3}$ | $V_{PP4}$ | AG1 | AG2 | AG3 | CG0 |
|---|---|---|---|---|---|---|---|
| 0 V | 10–16 V | 0 V | 0 V | 10–16 V | 0 V | 0 V | 0 V |

Thus, the high programming voltage is applied to the access gate of each memory cell in the first row. The high programming voltage is also applied to the $V_{PP}$ terminal of each memory cell in the second column. The access gates of the memory cells in the second and third rows receive the ground supply voltage, thereby preventing the memory cells in the second and third rows from being programmed. $V_{PP}$ terminals of each memory cell in the first, second and fourth columns receive the ground supply voltage, thereby preventing the memory cells in the first, second and fourth columns from being programmed. As a result, only memory cell 110B is programmed.

In an alternate embodiment, up to an entire row of memory cells, such as first row of memory cells 110A–110D, can be programmed at the same time. Table 5 below defines the voltages $V_{PP1}$–$V_{PP4}$, AG1–AG3 and CG0 required to simultaneously program memory cells 110B and 110D.

TABLE 5

ROW-BY-ROW PROGRAMMING VOLTAGES

| $V_{PP1}$ | $V_{PP2}$ | $V_{PP3}$ | $V_{PP4}$ | AG1 | AG2 | AG3 | CG0 |
|---|---|---|---|---|---|---|---|
| 0 V | 10–16 V | 0 V | 10–16 V | 10–16 V | 0 V | 0 V | 0 V |

In yet another alternate embodiment, up to an entire column of memory cells, such as second column of memory cells 110B, 110F, and 110J, can be programmed at the same time. Table 6 below defines the voltages $V_{PP1}$–$V_{PP4}$ AG1–AG3 and CG0 required to simultaneously program memory cells 110B and 110J.

TABLE 6

COLUMN-BY-COLUMN PROGRAMMING VOLTAGES

| $V_{PP1}$ | $V_{PP2}$ | $V_{PP3}$ | $V_{PP4}$ | AG1 | AG2 | AG3 | CG0 |
|---|---|---|---|---|---|---|---|
| 0 V | 10–16 V | 0 V | 0 V | 10–16 V | 0 V | 10–16 V | 0 V |

Although a 3×4 array of electrically erasable memory cells 110A–110L has been described in the present example, it is understood that much larger arrays are typically used in PLDs.

In one embodiment of the present invention, the SETB signal may be applied to each of the electrically erasable memory cells of the PLD on a common signal line. In accordance with an alternate embodiment of the present invention, the SETB signal is distributed along nodes of a delay chain driven by a master signal. As a result, the initial power-up configuration cycle does not occur simultaneously for all configuration circuits of the PLD. Rather, the initial power-up configuration cycle is time multiplexed across different sets of configuration circuits. As a result, a high power supply current spike may be avoided.

Because latch 105 has a dedicated electrically erasable memory cell 110, no complex addressing circuitry is required to access electrically erasable memory cell 110 during the initial power-up configuration cycle. In addition, there is no need to provide a complex routing path from the electrically erasable memory cell 110 to latch 105 during the power up configuration cycle. As a result, the complexity of configuration circuit 100 is greatly reduced with respect to the prior art.

Although the invention has been described in connection with several embodiments, it is understood that this invention is not limited to the embodiments disclosed, but is capable of various modifications, which would be apparent to one of ordinary skill in the art. For example, although configuration circuit 100 has been described in connection with a PLD, it is understood that configuration circuit 100 may be used in other types of programmable logic and memory devices. Moreover, although a specific electrically erasable memory cell 110 has been described, it is understood that other non-volatile memory cells can be used in other embodiments. Thus, the present invention is only limited by the following claims.

We claim:

1. A configuration circuit for a programmable logic device comprising:
    a non-volatile memory cell;
    a latch circuit coupled to a logic core of the programmable logic device; and
    an initialization circuit coupled to the non-volatile memory cell and the latch circuit, wherein the initialization circuit includes:
        a first switch element configured to selectively couple the latch circuit to a first voltage supply terminal; and
        a second switch element configured to selectively couple the latch circuit to the non-volatile memory cell;
        wherein the first and second switch elements are commonly coupled to receive a control signal, the first switch element coupling the latch circuit to the first voltage supply terminal when the control signal is in a first state, and the second switch element coupling the latch circuit to the non-volatile memory cell when the control signal is in a second state.

2. The configuration circuit of claim 1, wherein the first switch element comprises a p-channel transistor and the first voltage supply terminal provides a positive supply voltage.

3. The configuration circuit of claim 2, wherein the second switch element comprises an n-channel transistor.

4. The configuration circuit of claim 1, wherein the non-volatile memory cell comprises a memory transistor having a floating gate structure.

5. The configuration circuit of claim 4, further comprising means for programming and erasing the floating gate structure.

6. The configuration circuit of claim 4, further comprising:
    an access transistor;
    a tunnel diode coupled to the access transistor and the floating gate structure; and
    a capacitor structure coupled to the floating gate structure.

7. The configuration circuit of claim 1, wherein the latch circuit comprises a pair of cross-coupled inverters.

8. The configuration circuit of claim 1, further comprising a first latch access transistor coupled to the latch circuit.

9. The configuration circuit of claim 8, further comprising a second latch access transistor coupled to the latch circuit.

10. The configuration circuit of claim 1, further comprising a chain of delay elements for providing the control signal.

11. The configuration circuit of claim 1, wherein the non-volatile memory cell is an electrically erasable memory cell.

12. The configuration circuit of claim 1, wherein the non-volatile memory cell stores a bit and includes an output for providing the stored bit; and
    wherein the second switch element is configured to selectively couple the latch circuit to the output of the non-volatile memory cell.

* * * * *